(12) United States Patent
Ramkumar et al.

(10) Patent No.: US 7,042,054 B1
(45) Date of Patent: May 9, 2006

(54) SONOS STRUCTURE INCLUDING A DEUTERATED OXIDE-SILICON INTERFACE AND METHOD FOR MAKING THE SAME

(75) Inventors: Krishnaswamy Ramkumar, San Jose, CA (US); Frederick B. Jenne, Los Gatos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 114 days.

(21) Appl. No.: 10/740,205

(22) Filed: Dec. 18, 2003

Related U.S. Application Data

(62) Division of application No. 10/094,108, filed on Mar. 8, 2002, now Pat. No. 6,677,213.

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. .................. 257/406; 257/411
(58) Field of Classification Search .......... 257/288, 257/324, 347, 406, 411

See application file for complete search history.

(56) References Cited

U.S. PATENT DOCUMENTS

| | | | |
|---|---|---|---|
| 5,972,765 A | 10/1999 | Clark et al. | |
| 6,023,093 A | 2/2000 | Gregor et al. | |
| 6,114,734 A | 9/2000 | Eklund | |
| 6,140,187 A | 10/2000 | DeBusk et al. | |
| 6,147,014 A | 11/2000 | Lyding et al. | |
| 6,661,065 B1 * | 12/2003 | Kunikiyo | 257/411 |

* cited by examiner

*Primary Examiner*—Hoai Pham
(74) *Attorney, Agent, or Firm*—Kevin L. Daffer; Mollie E. Lettang; Daffer McDaniel, LLP

(57) ABSTRACT

A method for processing a semiconductor topography is provided, which includes diffusing deuterium across one or more interfaces of a silicon-oxide-nitride-oxide-silicon (SONOS) structure. In particular, the method may include diffusing deuterium across one or more interfaces of a SONOS structure during a reflow of a dielectric layer spaced above the SONOS structure. In some embodiments, the method may include forming a deutereated nitride layer above the SONOS structure prior to the reflow process. In addition or alternatively, the method may include forming a deutereated nitride layer within the SONOS structure prior to the reflow process. In some cases, the method may further include annealing the SONOS structure with a deutereated substance prior to forming the deutereated nitride layer. In either embodiment, a SONOS structure may be formed which includes deuterium arranged within an interface of a silicon layer and an oxide layer of the structure.

13 Claims, 3 Drawing Sheets

US 7,042,054 B1

SONOS STRUCTURE INCLUDING A DEUTERATED OXIDE-SILICON INTERFACE AND METHOD FOR MAKING THE SAME

This application is a divisional application from prior application SN 10/094,108 filed Mar. 8, 2002, now U.S. Pat. No. 6,677,213.

BACKGROUND OF THE INVENTION

1. Field of the Invention

This invention relates to semiconductor device manufacturing, and more particularly, to an improved oxide-nitride layer and a method for making the same.

2. Description of the Related Art

The following descriptions and examples are not admitted to be prior art by virtue of their inclusion within this section.

The formation of oxide layers upon silicon layers is commonly used within fabrication processes of a variety of semiconductor devices. Sometimes, however, irregularities may exist within the silicon surface or may be created during the formation of the oxide layer, both of which may bring about a disjointed oxide pattern which can lead to dangling bonds, often referred to as "interface traps" at the oxide-silicon interface. Dangling bonds are generally sporadic silicon-to-oxide atomic bonds, which readily accept mobile carriers (electrons or holes) at the oxide-silicon interface. The build-up of mobile carriers may generate high electric fields across the oxide layer and the continual passage of charge across the tunnel oxide region of a device. Consequently, interface traps may cause a variety of problems, such as shifts in the threshold voltage ($V_t$) of an ensuing device and/or breakdown of the oxide layer. In addition, the build-up of mobile carriers may increase the back tunneling current of non-volatile semiconductor memory cells, thereby dissipating the memory of the cells more quickly. Consequently, the presence of interface traps may degrade the long-term retention of non-volatile memory cells.

In some cases, interface traps within fabricated devices may be passivated such that the build-up of mobile carriers are reduced or eliminated for an amount of time, thereby theoretically improving device reliability. In particular, the silicon-to-oxide atomic bonds within an oxide-silicon interface may be made stronger to withstand the operation of the device for a longer period of time. For example, in some cases, devices may be annealed in hydrogen ($H_2$) to passivate interface traps. In other embodiments, devices may be annealed in deuterium ($D_2$) to passivate interface traps. Such anneals are typically performed subsequent to the formation of the device, such as after a contact or bond pad etch.

Although using hydrogen or deuterium anneals may passivate interface traps of fabricated devices, using such anneals may present problems affecting the functionality and reliability of the devices. In particular, such anneal processes typically require the use of "pure" hydrogen ($H_2$) or deuterium ($D_2$). "Pure" hydrogen and deuterium may refer to gases, which are free or substantially absent of other elements. Typically, free hydrogen and free deuterium include safety hazards, which make them difficult to incorporate into semiconductor fabrication processes. In particular, free hydrogen and free deuterium are both considered explosion hazards when used at temperatures greater than approximately 500° C. or exposed to oxygen. The temperature required for deuterium anneals, however, is typically between 500° C. and 700° C. Such a high temperature along with an annealing duration between approximately 4 to 5 hours, which is typically required for deuterium anneals, may severely degrade metallization with a device and/or cause certain dielectric materials to reflow. Moreover, such an anneal process may undesirably increase the thermal budget of a fabrication process, degrading the functionality of devices fabricated therefrom. In addition, deuterium cannot diffuse through nitride. Consequently, the use of a deuterium anneal in devices, which include nitride layers, such as SONOS devices, are limited in their capability to improve device reliability.

It would therefore be desirable to develop a safe and non-destructive method for passivating dangling bonds within a lower oxide-silicon interface of a SONOS structure. In particular, it may be desirable to develop a method for diffusing deuterium into a lower oxide-silicon interface of a SONOS structure.

SUMMARY OF THE INVENTION

The problems outlined above may be in large part addressed by a method for processing a semiconductor topography, which includes diffusing deuterium across one or more interfaces of a silicon-oxide-nitride-oxide-silicon (SONOS) structure. In particular, the method may include diffusing deuterium across one or more layer interfaces of a SONOS structure during a reflow of a dielectric layer spaced above the SONOS structure. In some embodiments, the method may include forming a deutereated nitride layer above the SONOS structure prior to the reflow process. In addition or alternatively, the method may include forming a deutereated nitride layer within the SONOS structure prior to the reflow process. In some cases, the method may further include annealing the SONOS structure with a deutereated substance prior to forming the deutereated nitride layer. In either embodiment, a SONOS structure may be formed which includes deuterium arranged within an interface of a silicon layer and an oxide layer of the structure.

As stated above, a method for processing a semiconductor topography is provided herein which includes diffusing deuterium across one or more layer interfaces of a SONOS structure during a reflow of a dielectric layer spaced above the SONOS structure. For example, in some embodiments, the method may include diffusing deuterium across an interface between a lower silicon layer and a lower oxide layer of a SONOS structure. In other embodiments, the method may additionally or alternatively include diffusing deuterium across an interface between an upper silicon layer and an upper oxide layer of the SONOS structure. In yet other embodiments, the method may include diffusing deuterium across an interface between either of the lower or upper oxide layers and a nitride layer of the SONOS structure. Furthermore, in some cases, the method may include introducing deuterium into at least one of the one or more layer interfaces. In other words, the method may include introducing deuterium into at least one interface that did not previously contain deuterium.

In either embodiment, the method may include forming a deutereated nitride layer prior to the reflow process. In some embodiments, the method may include forming a deutereated nitride layer within the SONOS structure. In such an embodiment, the method may include forming the deutereated nitride layer upon an oxide-silicon bilayer stack and forming a second oxide-silicon stack above the deutereated nitride layer to form a SONOS structure. In addition or alternatively, method may include forming a deutereated nitride layer above the SONOS structure. In either embodiment, forming the deutereated nitride layer may include depositing the nitride layer in an ambient including a deutereated substance, such as deutereated ammonia. In some cases, the method may include annealing the semiconductor topography prior to forming the deutereated nitride layer. Such an anneal process may include introducing deuterium into the semiconductor topography. In particular, the anneal process may include introducing deuterium into an upper portion of the semiconductor topography. As such, in some embodiments, the method may include annealing the semiconductor topography with a deutereated substance, such as deutereated ammonia, for example.

In addition, the method may include depositing a dielectric layer above the deutereated nitride layer prior to the reflow process. In particular, the method may include depositing a dielectric layer above the SONOS structure prior to the reflow process. In some embodiments, the dielectric layer may be deposited as a deutereated dielectric. In other embodiments, the dielectric layer may be deposited substantially absent of deuterium. In either embodiment, the method may further include reflowing the dielectric layer such that one or more interfaces of the SONOS structure may be diffused with deuterium. Such a reflow process may include exposing the semiconductor topography to steam, in some embodiments. In other embodiments, the reflow process may include exposing the semiconductor topography to an ambient including a deutereated substance.

Consequently, a SONOS structure is contemplated herein which includes a first silicon layer with an undoped lower portion and a first oxide layer arranged upon the first silicon layer. In some embodiments, the first silicon layer may include a silicon substrate, such as a monocrystalline substrate. The first oxide layer, on the other hand, may include an oxide material, such as deposited or thermally grown silicon dioxide. Regardless of the composition of the first silicon layer and first oxide layer, an interface between the first silicon layer and first oxide layer may include deuterium, in some embodiments. In addition, the SONOS structure may include a deutereated nitride layer arranged upon and in contact with the first oxide layer. In some embodiments, the deutereated nitride may include deutereated silicon nitride. In addition or alternatively, an interface between the first oxide layer and the nitride layer may include deuterium in some cases. Furthermore, the SONOS structure may include a second oxide layer arranged upon and in contact with the deutereated nitride layer. In some cases, the interface between the second oxide layer and the nitride layer may include deuterium. Moreover, the SONOS structure may include a second silicon layer arranged upon and in contact with the second oxide layer. Such a second silicon layer may include doped polysilicon in some embodiments.

There may be several advantages to processing a semiconductor topography according to the method described herein. For example, deuterium may be diffused across an oxide-silicon interface such that dangling bonds within the interface may be passivated. In this manner, the endurance and retention of devices fabricated by the method described herein may be improved. In addition, dangling bonds of devices including nitride layers, such as SONOS devices, may be passivated. Moreover, the method described herein may not cause damage to the metallization or interlevel dielectrics of devices. In addition, the method may not substantially increase the thermal budget of devices. In this manner, the functionality and reliability of devices may not be degraded. Furthermore, annealing in an ambient of pure deuterium may be avoided, thereby reducing the safety hazards of semiconductor fabrication processes.

BRIEF DESCRIPTION OF THE DRAWINGS

Other objects and advantages of the invention will become apparent upon reading the following detailed description and upon reference to the accompanying drawings in which.

Figure 1:
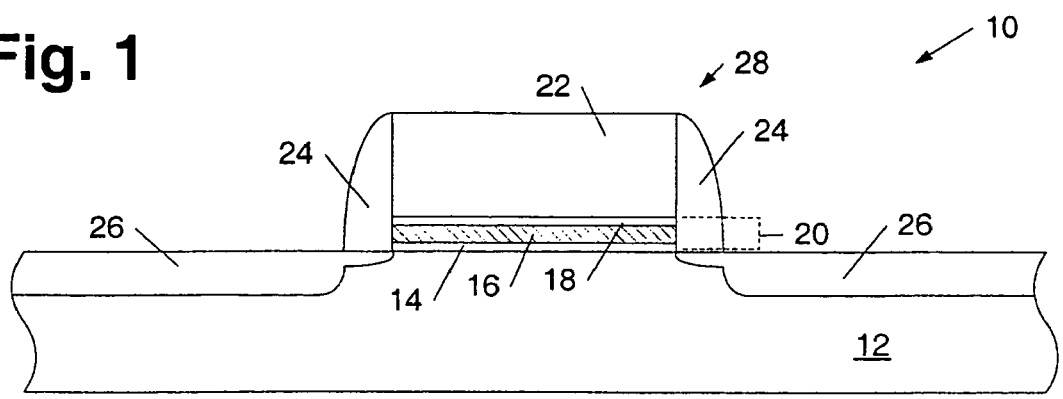
FIG. 1 depicts a partial cross-sectional view of a semiconductor topography including a SONOS structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography are shown in FIGS. 1–8. In particular, exemplary embodiments of a method for diffusing deuterium across one or more interface layers of a silicon-oxide-nitride-oxide-silicon (SONOS) structure during a reflow process of a dielectric layer spaced above the SONOS structure is provided. FIG. 1 depicts a partial cross-sectional view of semiconductor topography 10 with SONOS structure 28 arranged upon semiconductor layer 12. Semiconductor layer 12 may be a silicon-based semiconductor substrate such as a monocrystalline silicon, silicon-germanium, silicon-on-insulator, or silicon-on-sapphire substrate. In addition, semiconductor layer 12 may be doped either n-type or p-type. Alternatively, semiconductor layer 12 may be substantially undoped. In yet other embodiments, semiconductor layer 12 may include structures and layers formed upon a semiconductor substrate. The structures and layers may include, but are not limited to, dielectric layers, gate structures, or contact structures. In such an embodiment, the upper surface of semiconductor layer 12 may include a silicon-based layer, such as undoped polysilicon. In some cases, semiconductor layer 12 may include source and drain regions 26 self-aligned to SONOS structure 28 as shown in FIG. 1. In addition or alternatively, semiconductor layer 12 may further include isolation regions (not shown) surrounding the active region of the SONOS structure.

As stated above, SONOS structure 28 may be formed upon semiconductor layer 12. In particular, SONOS structure 28 may include silicon layer 22 formed upon and in contact with oxide-nitride-oxide (ONO) dielectric 20, which is formed upon semiconductor layer 12. As shown in FIG. 1, ONO dielectric 20 may include lower oxide layer 14, nitride layer 16, and upper oxide layer 18. Lower oxide layer 14 may include a dielectric material, such as silicon dioxide ($SiO_2$) or silicon oxynitride ($SiO_xN_y(H_z)$) and may be substantially doped or undoped. Moreover, lower oxide layer 14 may have a thickness, for example, between approximately 15 angstroms and approximately 60 angstroms. Larger or smaller thicknesses of lower oxide layer 14, however, may be appropriate depending on the semiconductor device being formed. In some embodiments, lower oxide layer 14 may be grown upon semiconductor layer 12 using wet or dry thermal oxidation of a silicon substrate. Alternatively, lower oxide layer 14 may be deposited on semiconductor layer 12 by chemical-vapor deposition ("CVD") using a gas that includes silane and oxygen sources. For example, lower oxide layer 14 may be deposited by a gas that includes silane ($SiH_4$), chlorosilane ($SiH_xCl_y$), or dichlorosilane ($SiCl_2H_2$) and oxygen. In other embodiments, the decomposition of tetraethyl orthosilicate (TEOS) may be performed in a CVD reactor to form lower oxide layer 14.

Nitride layer 16, on the other hand, may be deposited upon lower oxide layer 14 using CVD with a nitrogen rich ambient. For example, nitride layer 16 may be formed by a CVD process using a silicon source, such as silane, chlorosilane, or dichlorosilane, and a nitrogen source, such as nitrogen ($N_2$), nitrous oxide ($N_2O$), and ammonia ($NH_3$). In general, nitride layer 16 may include a nitride material, such as silicon nitride, silicon oxynitride, or silicon-rich nitride. In some embodiments, nitride layer 16 may include a deutereated nitride material. In such an embodiment, nitride layer 16 may be formed by CVD using an ambient comprising a deutereated substance, such as deutereated ammonia ($ND_3$), for example. In either embodiment, the CVD deposition of nitride layer 16 may be performed at a substrate temperature between approximately 600° C. and approximately 950° C., a deposition chamber pressure between approximately 5 mT and approximately 500 mT, and for a period of time between approximately 5 minutes and approximately 20 minutes. Alternatively, nitride layer 16 may be formed by nitriding a deposited layer, such as silicon dioxide, in a subsequent processing step. In such an embodiment, the deposited layer may be exposed to either a deutereated or non-deutereated substance, depending on the design specifications of the device. In either embodiment, nitride layer 16 may have, for example, a thickness between approximately 50 angstroms and approximately 200 angstroms. However, larger or smaller thicknesses of nitride layer 16 may be used depending on the semiconductor device being formed.

Similar to lower oxide layer 14, upper oxide layer 18 may be deposited using CVD from ambient including silane and oxygen sources. For example, silane sources may include silane, chlorosilane, dichlorosilane, or TEOS. In addition, oxygen sources may include oxygen or nitrous oxide, for example. Furthermore, upper oxide layer 18 may have a thickness between approximately 15 angstroms and approximately 100 angstroms. Larger or smaller thicknesses of upper oxide layer 18 may, however, be appropriate depending on the semiconductor device being formed. In general, upper oxide layer 18 may include a dielectric material, such as silicon dioxide or silicon oxynitride and may be substantially doped or undoped. As stated above, SONOS structure 28 may include silicon layer 22 formed upon ONO dielectric 20. As such, SONOS structure 28 may include silicon layer 22 formed upon and in contact with upper oxide layer 18. In general, silicon layer 22 may include a silicon containing material, such as polysilicon or silicon-germanium. In addition, silicon layer 22 may be doped, either n-type or p-type. The thickness of silicon layer 22 may be between approximately 500 angstroms and approximately 2500 angstroms. Larger or smaller thicknesses of silicon layer 22, however, may be used depending on the semiconductor device being formed.

In some embodiments, SONOS structure 28 may further include sidewall spacers 24 as shown in FIG. 1. In general, sidewall spacers 24 may be formed by depositing a dielectric material over SONOS structure 28 and adjacent portions of semiconductor layer 12 using similar techniques as those used for the layers of ONO dielectric 20. Subsequently, the deposited layer may be aniostropically etched to form sidewall spacers 24 along the sidewalls of SONOS structure 28. In general, sidewall spacers 24 may include a dielectric material, such as silicon dioxide or silicon nitride, for example. In some cases, sidewall spacers 24 may include deutereated nitride. In such an embodiment, the formation of sidewall spacers 24 may include depositing a nitride layer upon semiconductor topography 10 in an ambient of dichlorosilane and deutereated ammonia, for example.

In addition or alternatively, SONOS structure may include an additional layer arranged upon silicon layer 22 (not shown). Such an additional layer may be used to pattern silicon layer 22, upper oxide layer 18, nitride layer 16, and lower oxide layer 14 to form SONOS structure 28. In such an embodiment, the additional layer may include a dielectric material such as silicon oxide, silicon nitride, or silicon oxynitride. In other embodiments, the additional layer may be used to strap subsequently formed gate regions of opposite conductivity type together. In particular, the additional layer may provide a conductive path across a p-n junction formed when a polysilicon connection is made to gates of opposite conductivity type. As such, the additional layer may include a conductive material in such an embodiment. In some cases, the additional layer may also serve to reduce gate resistance. Accordingly, the additional layer may include a low-resistivity material, such as tungsten, tungsten silicide, cobalt silicide, titanium silicide, or nickel silicide, in some embodiments. In yet other embodiments, the additional layer may further or alternatively serve as a diffusion barrier layer, such that impurities in silicon layer 22 may be prevented from diffusing into overlying layers.

Figure 2:
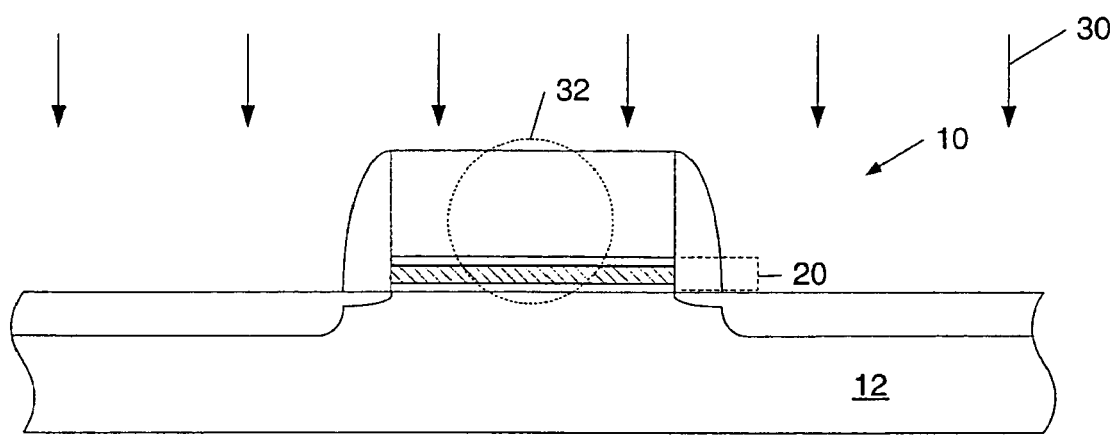
FIG. 2 depicts a partial cross-sectional view of the semiconductor topography in which deuterium is introduced into the upper portion of the SONOS structure of FIG. 1.

FIG. 2 illustrates semiconductor topography 10 exposed to annealing process 30. In general, annealing process 30 may include exposing semiconductor topography 10 to a deutereated substance such as, deutereated ammonia, for example. In addition, annealing process 30 may include exposing semiconductor topography 10 to a temperature between approximately 700° C. and approximately 850° C. for a period of time between approximately 30 seconds and 5 minutes. In this manner, annealing process 30 may be adapted to introduce deuterium into semiconductor topography 10. In particular, such an annealing process may be adapted to introduce deuterium into SONOS structure 28 and adjacent portions of semiconductor layer 12. It is believed that, in some cases, annealing process 30 may enhance the subsequent diffusion of deuterium into the interfaces of SONOS structure 28 during the reflow of a dielectric formed above SONOS structure 28 as described in FIG. 6 in more detail below. As such, in some embodiments, the inclusion of annealing process 30 may be beneficial. In other embodiments, annealing process 30 may be omitted from the fabrication process. In such an embodiment, the exclusion of such an anneal process may be beneficial for reducing contributions to the thermal budget of the fabrication process. Consequently, the method may continue to FIG. 4 subsequent to FIG. 1 in such an embodiment.

Figure 3:
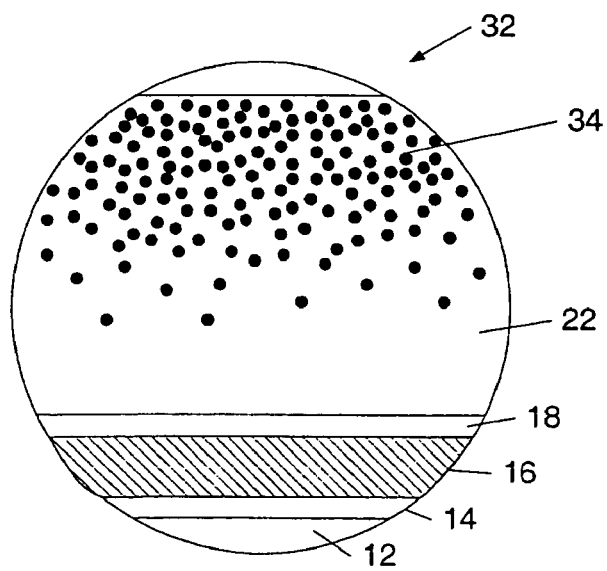
FIG. 3 depicts a partial cross-sectional view of a portion of the semiconductor topography in FIG. 2.

In some embodiments, annealing process 30 may be adapted to introduce deuterium into an upper portion of SONOS structure 28 and adjacent portions of semiconductor layer 12. A magnified view of portion 32 of semiconductor topography 10 in such an embodiment is shown in FIG. 3. In particular, FIG. 3 illustrates deuterium dopants 34 arranged within the upper portion of silicon layer 22. In yet other embodiments, annealing process 30 may be adapted to introduce deuterium into lower portions of semiconductor topography 10. As such, deuterium dopants 34 may be arranged within other portions of SONOS structure 28, such as in lower portions of silicon layer 22, upper oxide layer 18, nitride layer 16, and/or lower oxide layer 14. In addition, deuterium dopants 34 may be arranged within portions of sidewall spacers 24 and adjacent portions of semiconductor layer 12, including source and drain regions 26. Since annealing process 30 introduces deuterium into the upper surface of semiconductor topography 10, the diffusion of deuterium dopants 34 during annealing process 30 may be successive through SONOS structure 28. In this manner, the arrangement of deuterium dopants 34 may begin at the upper surface of silicon layer 22 and continue through lower portions of SONOS structure 28.

However, in some embodiments, nitride layer 16 and/or sidewall spacers 24 may include deuterium dopants formed during the deposition of such layers as noted in reference to FIG. 1 above. As such, in some embodiments, deuterium dopants 34 may be arranged in a non-successive manner throughout SONOS structure 28. For example, in some embodiments, magnified portion 32 may include deuterium dopants within the upper portion of silicon layer 22 and nitride layer 16, without deuterium dopants arranged within upper oxide layer 18. In other cases, however, magnified portion 32 may further include deuterium dopants arranged within surrounding layers of nitride layer 16, including upper oxide layer 18. Such an arrangement of deuterium may be attributed to deuterium residing in nitride layer 16 diffusing into surrounding layers during annealing process 30. Diffusion of deuterium within sidewall spacers 24 may similarly occur during annealing process 30. Alternatively, annealing process 30 may be adapted such that the deuterium atoms residing in nitride layer 16 and/or sidewall spacers do not diffuse into surrounding layers.

Figure 4:
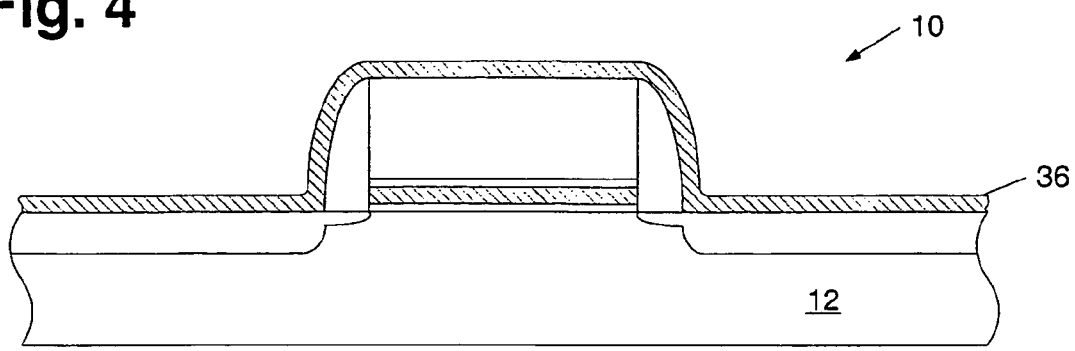
FIG. 4 depicts a partial cross-sectional view of the semiconductor topography in which a nitride layer is deposited subsequent to the deuterium introduction of FIG. 2.

FIG. 4 illustrates the formation of nitride layer 36 upon the upper surface of semiconductor topography 10. In general, nitride layer 36 may include similar materials as may be used for nitride layer 16. As such, nitride layer 36 may include, for example, silicon nitride, silicon oxynitride, or silicon-rich nitride. In addition, nitride layer 36 may be deposited using similar processes as may be used for nitride layer 16. In particular, nitride layer 36 may be formed by nitriding a deposited layer, such as silicon dioxide, in a subsequent processing step. Alternatively, nitride layer 36 may be deposited using CVD with an ambient including a silicon source, such as silane, chlorosilane, or dichlorosilane, and a nitrogen source, such as nitrogen, nitrous oxide, and ammonia, for example. Such a CVD deposition process may include exposing semiconductor topography 10 to a temperature between approximately 600° C. and approximately 950° C. and a deposition chamber pressure between approximately 5 mT and approximately 500 mT for a period of time between approximately 20 minutes and approximately 100 minutes. In some embodiments, nitride layer 36 may include a deutereated nitride material. In such an embodiment, nitride layer 36 may be formed by exposing semiconductor topography 10 to an ambient comprising a deutereated substance, such as deutereated ammonia, for example. In either embodiment, nitride layer 36 may have, for example, a thickness between approximately 300 angstroms and approximately 1000 angstroms. However, larger or smaller thicknesses of nitride layer 36 may be used depending on the semiconductor device being formed.

In some cases, a "pad oxide" layer (not shown) may be formed over semiconductor topography 10 prior to the deposition of nitride layer 36. Such a layer may serve to reduce inherent stresses between a nitride layer 36 and semiconductor layer 12. In addition or alternatively, the pad oxide layer may promote adhesion of nitride layer 36 upon semiconductor layer 12. In general, the pad oxide layer may include similar materials as may be used for upper oxide layer 18. As such, a pad oxide layer may include, for example, silicon dioxide ($SiO_2$) or silicon oxynitride ($SiO_x$-$N_y(H_z)$). In addition, the formation of such a layer may include similar deposition processes and thickness ranges as may be used for upper oxide layer 18. In other embodiments, such a pad oxide layer may be omitted from semiconductor topography 10. In such an embodiment, nitride layer 36 may be formed upon semiconductor layer 12 and SONOS structure 28 as shown in FIG. 4.

Figure 5:
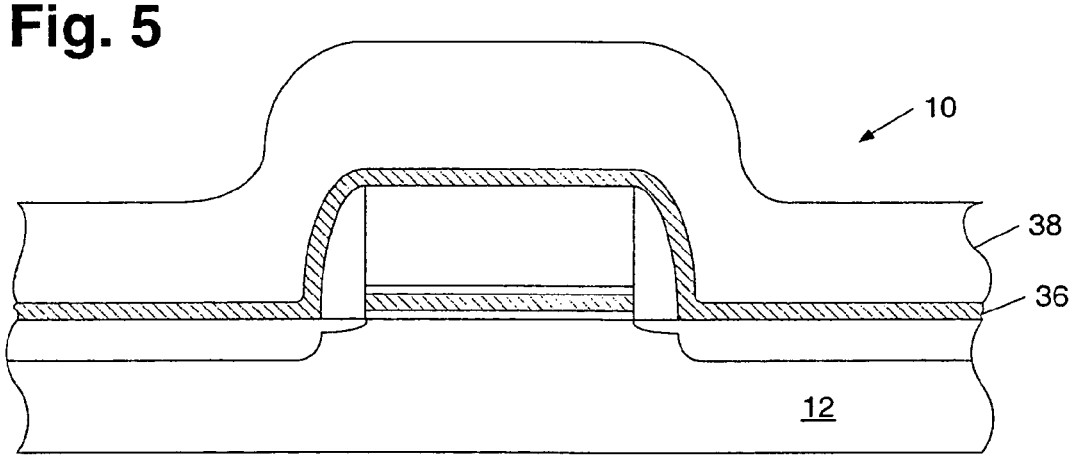
FIG. 5 depicts a partial cross-sectional view of the semiconductor topography in which a dielectric layer is deposited subsequent to the nitride layer deposition of FIG. 4.
Figure 6:
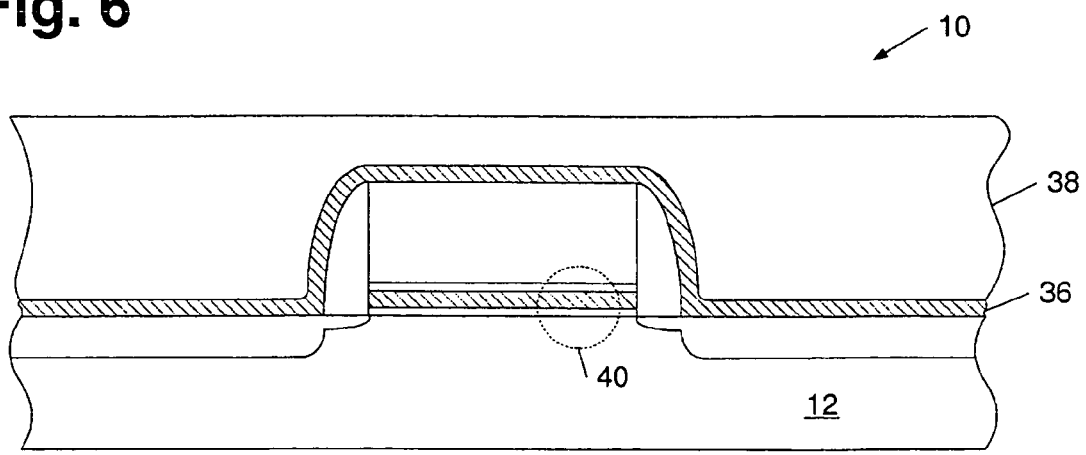
FIG. 6 depicts a partial cross-sectional view of the semiconductor topography in which the dielectric layer is reflowed subsequent to the dielectric layer deposition of FIG. 5.

FIG. 5 illustrates the deposition of dielectric layer 38 over nitride layer 36. In particular, FIG. 5 illustrates dielectric layer 38 upon and in contact with nitride layer 36. In general, dielectric layer 38 may serve as an interlevel dielectric and may include any dielectric material. For example, in some embodiments, dielectric layer 38 may include silicon dioxide or silicon oxynitride, either doped or undoped. In other embodiments, dielectric layer 38 may include borophosphorus silicate glass (BPSG), phosphorus silicate glass (PSG), or fluorinated silicate glass (FSG). In some embodiments, dielectric layer 38 may include a deutereated dielectric material. Alternatively, dielectric layer 38 may be deposited substantially absent of deuterium. In either case, dielectric layer 38 may be reflowed such that a substantially planar upper surface may be obtained as shown in FIG. 6. Such a reflow process may include heating semiconductor topography 10 at a temperature between approximately 700° C. and approximately 900° C., and more preferably at approximately 800° C. In addition, the reflow process may be conducted for a time period between approximately 15 minutes and approximately 60 minutes, and more preferably for approximately 30 minutes. In some embodiments, the reflow process may include exposing semiconductor topography 10 to an ambient of steam. In other embodiments, the reflow process may include exposing semiconductor topography 10 to deuterium oxide vapor, which is sometimes referred to as "heavy water."

In either case, the reflow process is preferably adapted to diffuse deuterium through one or more interface layers of SONOS structure 28. In particular, the reflow process may be adapted to diffuse deuterium through one or more of the interfaces between silicon layer 22, upper oxide layer 18, nitride layer 16, lower oxide layer 14, and semiconductor layer 12. In some embodiments, the reflow process may be adapted to introduce deuterium into one or more of the interfaces of SONOS structure 28. In other words, reflowing dielectric layer 38 may include introducing deuterium into at least one interface that did not previously contain deuterium. In either embodiment, the diffusion of deuterium through SONOS structure 28 may depend on the amount and location of deuterium atoms located within semiconductor topography 10 prior to the reflow process. In particular, the more deuterium atoms located within the elements of semiconductor topography 10, the more dispersion of deuterium that will take place. In addition, the diffusion of deuterium atoms may depend on the time and temperature at which the reflow process is conducted. In general, longer times and higher temperatures may generate more diffusion of such atoms.

Figure 7:
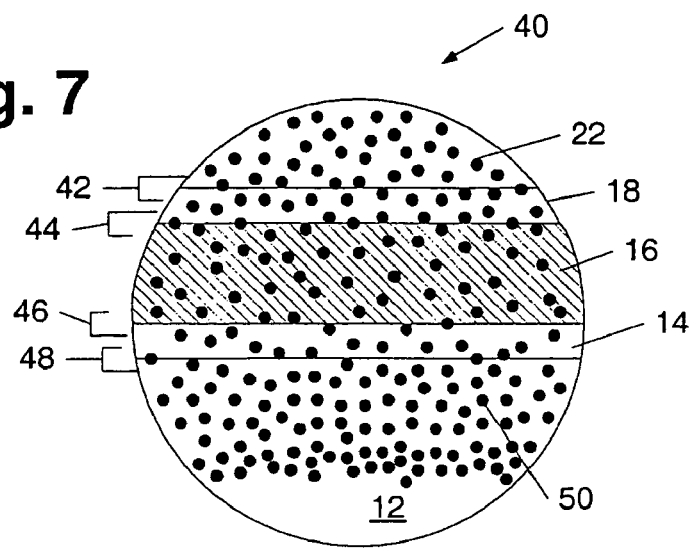
FIG. 7 depicts a partial cross-sectional view of a portion of the semiconductor topography in FIG. 6.

An exemplary embodiment of a diffusion of deuterium through the interfaces of SONOS structure 28 is illustrated in FIG. 7. In particular, FIG. 7 illustrates a magnified view of portion 40 of semiconductor topography 10, in which silicon layer 22 is arranged over ONO dielectric 20 and semiconductor layer 12. As shown in FIG. 7, deuterium dopants 50 may be diffused into interfaces 42, 44, 46, and 48. Interface 42 may represent the interface between silicon layer 22 and upper oxide layer 18, while interface 44 may represent the interface between upper oxide layer 18 and nitride layer 16. Likewise, interface 46 may represent the interface between nitride layer 16 and lower oxide layer 14, while interface 48 may represent the interface between lower oxide layer 14 and semiconductor layer 12. In an alternative embodiment, deuterium dopants 50 may be diffused in less than all of the interfaces. In particular, deuterium dopants 50 may be diffused into any one of interfaces 42, 44, 46, and 48. In some cases, deuterium dopants 50 may include deuterium dopants 34 diffused from the upper portion of silicon layer 22. In addition or alternatively, deuterium dopants 50 may include deuterium diffused from other portions of semiconductor topography 10. For example, deuterium dopants 50 may include deuterium diffused from nitride layer 36, nitride layer 16, and/or sidewall spacers 24 when each of the respective elements includes a deutereated nitride material. Furthermore, deuterium dopants 50 may include deuterium diffused from the ambient of the reflow process such as, when dielectric layer 38 is reflowed in an ambient of deuterium oxide vapor.

In general, deuterium may diffuse in any direction, including vertical and lateral diffusion. As such, deuterium atoms residing in nitride layer 36 prior to the reflow process may diffuse into dielectric layer 38, semiconductor layer 12 including source and drain regions 26, and SONOS structure 28 including silicon layer 22, ONO dielectric 20, and sidewall spacers 24. Similarly, deuterium atoms residing in nitride layer 16 and/or sidewall spacers 24 prior to the reflow process may diffuse into surrounding elements of semiconductor topography 10. Without being bound to theory, it is believed that introduction of deuterium during such a reflow process may serve to migrate, occupy and substantially neutralize many of the trap sites located in the oxide-silicon interfaces of SONOS structure 28. In other words, the introduction of deuterium within oxide-silicon interfaces 42 and 48 of SONOS structure 28 may passivate the dangling bonds existing within such interfaces. Consequently, the endurance and retention of a device containing SONOS structure 28 may be improved. In particular, the retention of a device containing a SONOS structure with dangling bonds passivated with deuterium may be extended between approximately 50% and approximately 150% as compared to a device containing a SONOS structure with dangling bond passivated with hydrogen. Larger or smaller extensions, however, may be obtained depending on the device being tested and the testing parameters.

Figure 8:
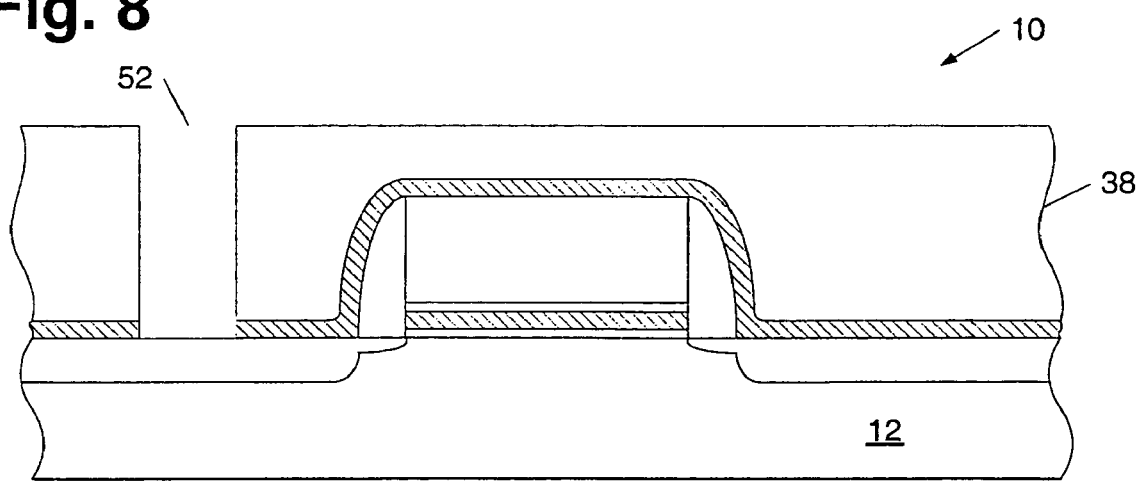
FIG. 8 depicts a partial cross-sectional view of the semiconductor topography in which contact opening is formed subsequent to the reflow of the dielectric layer in FIG. 6.

In some embodiments, semiconductor topography 10 may be further processed subsequent to the reflow of dielectric layer 38. For example, in some embodiments, dielectric layer 38 and nitride layer 36 may be etched to form contact opening 52 as shown in FIG. 8. In such an embodiment, nitride layer 36 may serve as an etch stop layer. In particular, the inclusion of nitride layer 36 may prevent semiconductor layer 12 from being etched during the etch process of dielectric layer 38. Subsequent to etching dielectric layer 38, nitride layer 36 may be etched to expose semiconductor layer 12. In addition, contact opening 52 may be filled with a conductive material (not shown) such that electrical connection may be made to source and drain region 24. Although FIG. 8 illustrates further processing of semiconductor topography 10 to include the formation of a contact opening, additional or alternative processing of semiconductor topography 10 may be conducted. FIG. 8 is merely shown as an exemplary embodiment, and is not shown to restrict the formation of additional layers or structures upon or within semiconductor topography 10.

It will be appreciated to those skilled in the art having the benefit of this disclosure that this invention is believed to provide a method for diffusing deuterium into one or more interfaces of a SONOS structure. Further modifications and alternative embodiments of various aspects of the invention will be apparent to those skilled in the art in view of this description. For example, the method described herein is not limited to diffusing deuterium into SONOS structures, but rather may be used for diffusing deuterium into any structure or layer. It is intended that the following claims be interpreted to embrace all such modifications and changes and, accordingly, the drawings and the specification are to be regarded in an illustrative rather than a restrictive sense.

What is claimed is:

1. A silicon-oxide-nitride-oxide-silicon structure comprising:
   a first oxide layer arranged upon a silicon-based semiconductor substrate, wherein an interface between the silicon-based semiconductor substrate and the first oxide layer comprises deuterium;
   a nitride layer arranged upon and in contact with the first oxide layer;
   a second oxide layer arranged upon and in contact with the nitride layer; and
   a second silicon layer arranged upon and in contact with the second oxide layer, wherein an interface between the second silicon layer and second oxide layer comprises deuterium.

2. The silicon-oxide-nitride-oxide-silicon structure of claim 1, wherein a lateral length of the interface between the silicon-based semiconductor substrate and the first oxide layer is bound by opposing sidewalls of the structure, and wherein said deuterium is arranged across an entirety of said lateral length.

3. The silicon-oxide-nitride-oxide-silicon structure of claim 1, wherein said nitride layer comprises deuterium.

4. The silicon-oxide-nitride-oxide-silicon structure of claim 1, wherein an interface between the first oxide layer and the nitride layer comprises deuterium.

5. The silicon-oxide-nitride-oxide-silicon structure of claim 1, wherein an interface between the nitride layer and the second oxide layer comprises deuterium.

6. A semiconductor topography, comprising:
   a silicon-oxide-nitride-oxide-silicon (SONOS) structure; and
   a nitride layer comprising deuterium arranged above the SONOS structure.

7. The semiconductor topography of claim 6, further comprising a dielectric layer comprising deuterium arranged above the nitride layer.

8. The semiconductor topography of claim 6, wherein the SONOS structure comprises an oxide layer arranged upon and in contact with a silicon-based semiconductor substrate, wherein an interface between the silicon-based semiconductor substrate and the oxide layer comprises deuterium.

9. The semiconductor topography of claim 6, wherein the SONOS structure comprises a deutereated nitride layer.

10. The semiconductor topography of claim 6, wherein the SONOS structure comprises;

an oxide layer; and
a silicon layer arranged upon and in contact with the oxide layer, wherein an interface between the silicon layer and the oxide layer comprises deuterium.

11. The semiconductor topography of claim 6, wherein all layers of the SONOS structure comprise deuterium.

12. The semiconductor topography of claim 6, wherein at least one but less than all the layers of the SONOS structure comprise deuterium.

13. The semiconductor topography of claim 6, further comprising deutereated dielectric spacers interposed between the sidewalls of the SONOS structure and the nitride layer.

* * * * *